United States Patent
Oie et al.

(10) Patent No.: US 12,245,365 B2
(45) Date of Patent: Mar. 4, 2025

(54) HIGH-FREQUENCY ELECTRONIC COMPONENT AND MODULE

(71) Applicant: Murata Manufacturing Co., Ltd., Kyoto (JP)

(72) Inventors: Hirofumi Oie, Kyoto (JP); Ikuo Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 208 days.

(21) Appl. No.: 18/174,201

(22) Filed: Feb. 24, 2023

(65) Prior Publication Data

US 2023/0225045 A1 Jul. 13, 2023

Related U.S. Application Data

(63) Continuation of application No. PCT/JP2021/023888, filed on Jun. 24, 2021.

(30) Foreign Application Priority Data

Aug. 26, 2020 (JP) ................ 2020-142402

(51) Int. Cl.
*H05K 9/00* (2006.01)
*H05K 1/02* (2006.01)
*H05K 1/03* (2006.01)

(52) U.S. Cl.
CPC ............. *H05K 1/024* (2013.01); *H05K 1/023* (2013.01); *H05K 1/0306* (2013.01)

(58) Field of Classification Search
CPC ................ H05K 1/0306; H05K 9/00
See application file for complete search history.

(56) References Cited

U.S. PATENT DOCUMENTS

| | | | |
|---|---|---|---|
| 2012/0168214 | A1 | 7/2012 | Kashiwagi et al. |
| 2014/0016293 | A1* | 1/2014 | Song ............... H05K 1/0218 29/829 |
| 2015/0126134 | A1 | 5/2015 | Lobianco et al. |
| 2018/0166394 | A1* | 6/2018 | Otsubo ............. H01L 23/552 |
| 2018/0277490 | A1* | 9/2018 | Yoon ............... H01L 23/3135 |

(Continued)

FOREIGN PATENT DOCUMENTS

| | | |
|---|---|---|
| JP | 2011-077430 A | 4/2011 |
| JP | 2015-091135 A | 5/2015 |

(Continued)

OTHER PUBLICATIONS

International Search Report for PCT/JP2021/023888 dated Sep. 14, 2021.

*Primary Examiner* — Sherman Ng
(74) *Attorney, Agent, or Firm* — McDonald Hopkins LLC

(57) ABSTRACT

A high-frequency electronic component includes a ceramic multilayer substrate, ground electrodes provided at different layers of the ceramic multilayer substrate, and a shielding film covering at least a side surface among surfaces of the ceramic multilayer substrate. Two or more of the ground electrodes are exposed to the side surface of the ceramic multilayer substrate and are electrically connected to the shielding film. On the side surface of the ceramic multilayer substrate, the two or more of the ground electrodes do not overlap each other in a thickness direction of the ceramic multilayer substrate.

20 Claims, 2 Drawing Sheets

(56) References Cited

U.S. PATENT DOCUMENTS

2019/0035716 A1 1/2019 Kita
2021/0043583 A1 2/2021 Nomura et al.

FOREIGN PATENT DOCUMENTS

| JP | 2019-114669 A | 7/2019 |
| WO | 2017/170535 A1 | 10/2017 |
| WO | 2019/216299 A1 | 11/2019 |

* cited by examiner

HIGH-FREQUENCY ELECTRONIC COMPONENT AND MODULE

CROSS REFERENCE TO RELATED APPLICATION

This is a continuation of International Application No. PCT/JP2021/023888 filed on Jun. 24, 2021 which claims priority from Japanese Patent Application No. 2020-142402 filed on Aug. 26, 2020. The contents of these applications are incorporated herein by reference in their entireties.

BACKGROUND OF THE DISCLOSURE

Field of the Disclosure

The present disclosure relates to high-frequency electronic components and modules.

Description of the Related Art

Some high-frequency electronic components mounted on mobile devices and others are provided with a shielding film to block magnetic waves.

For example, Patent Literature 1 discloses a shielded packaged device including a ceramic multilayer substrate; a die mounted on the upper surface of the ceramic substrate; an overmold sealing the die; and a conformal conductive coating covering the upper and side surfaces of the overmold and the side surfaces of the ceramic multilayer substrate. The side surfaces of the ceramic multilayer substrate are provided with multiple conductive layers and these conductive layers are electrically connected with the conformal conductive coating so that the conformal conductive coating functions as a shielding film.

PATENT LITERATURE

Patent Literature 1: JP 2015-91135 A

BRIEF SUMMARY OF THE DISCLOSURE

A shielding film on the side surfaces of a ceramic multilayer substrate may be formed by sputtering, for example. In order to prevent formation of a shielding film on the mounting surface of the ceramic multilayer substrate, sputtering is performed with the ceramic multilayer substrate being placed such that the surface opposite to the mounting surface faces the target.

In the case where multiple conductive layers overlap in the thickness direction, as in the case of the ceramic multilayer substrate disclosed in Patent Literature 1, a phenomenon such as the micro-loading effect occurs, in other words, the film-forming rate changes due to the sparseness and denseness of the pattern. In this case, the shielding film is caused to have an insufficient thickness on the surface of the conductive layer at a position farther from the target, which causes poor electrical connection and low reliability.

The present disclosure is made to solve the above issue and aims to provide a high-frequency electronic component having good electrical connection and high reliability.

The high-frequency electronic component of the present disclosure includes: a ceramic multilayer substrate; ground electrodes provided at different layers of the ceramic multilayer substrate; and a shielding film covering at least a side surface among surfaces of the ceramic multilayer substrate, two or more of the ground electrodes being exposed to the side surface of the ceramic multilayer substrate and being electrically connected to the shielding film, on the side surface of the ceramic multilayer substrate, the two or more of the ground electrodes not overlapping each other in a thickness direction of the ceramic multilayer substrate.

The module of the present disclosure includes the high-frequency electronic component of the present disclosure.

The present disclosure can provide a high-frequency electronic component having good electrical connection and high reliability.

DETAILED DESCRIPTION OF THE DISCLOSURE

Figure 1:
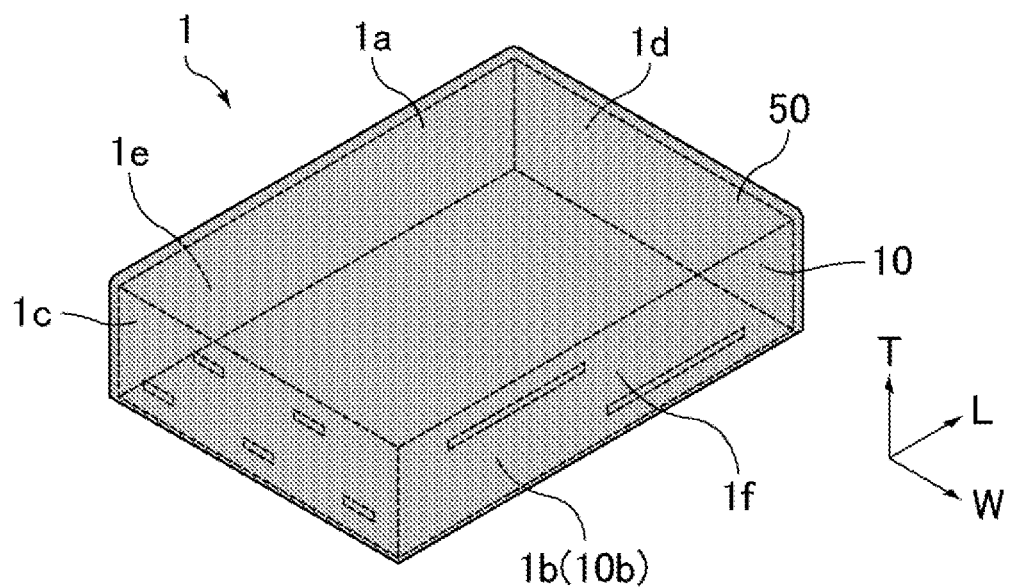
FIG. 1 is a schematic perspective view of an example of the high-frequency electronic component of the present disclosure.

The high-frequency electronic component of the present disclosure is described hereinbelow.

The present disclosure is not limited to the following preferred embodiments, and may be suitably modified without departing from the gist of the present disclosure. Combinations of two or more preferred structures described in the following are also within the scope of the present disclosure.

High-Frequency Electronic Component

The high-frequency electronic component of the present disclosure includes: a ceramic multilayer substrate; ground electrodes provided at different layers of the ceramic multilayer substrate; and a shielding film covering at least a side surface among surfaces of the ceramic multilayer substrate, two or more of the ground electrodes being exposed to the side surface of the ceramic multilayer substrate and being electrically connected to the shielding film, on the side surface of the ceramic multilayer substrate, the two or more of the ground electrodes not overlapping each other in a thickness direction of the ceramic multilayer substrate.

In the high-frequency electronic component of the present disclosure, two or more of the ground electrodes do not overlap each other in the thickness direction of the ceramic multilayer substrate on the same side surface of the ceramic multilayer substrate. Thus, this structure prevents any influence of the distance from the target caused by a phenomenon such as the micro-loading effect when sputtering is performed to form a shielding film. The structure is also less likely to cause the shielding film to have an insufficient thickness on the side surfaces of the ceramic multilayer substrate when sputtering is performed to form a shielding film, reducing the occurrence of poor electrical connection.

Ceramic Multilayer Substrate

The ceramic multilayer substrate may be, for example, a stack of an insulating layer containing a ceramic material and a wiring layer to serve as a conductive line.

Examples of the ceramic material contained in the insulating layer include a high temperature co-fired ceramic (HTCC) material and a low temperature co-fired ceramic (LTCC) material. Preferred is a low temperature co-fired ceramic material.

The low temperature co-fired ceramic material means a ceramic material sinterable at a firing temperature of 1000° C. or lower and is co-fireable with a metallic material, preferably such as silver or copper, used to form a conductive line.

Examples of the low temperature co-fired ceramic material include those containing $SiO_2$—CaO—$Al_2O_3$—$B_2O_3$ glass ceramic or $SiO_2$—MgO—$Al_2O_3$—$B_2O_3$ glass ceramic.

Alumina powder may also be used as a ceramic material.

For example, the wiring layer defines a passive element such as a capacitor or an inductor or defines a connection line that provides an electrical connection between elements.

Examples of the material defining the wiring layer include silver and copper.

The wiring layer may contain a ceramic material.

The ceramic material contained in the wiring layer is preferably the same as the ceramic material contained in the insulating layer.

The ceramic multilayer substrate may have any shape, and preferably has a substantially cubic shape having a first main surface and a second main surface opposite to each other in the thickness direction, a first side surface and a second side surface opposite to each other in the length direction perpendicular to the thickness direction, and a third side surface and a fourth side surface opposite to each other in the width direction perpendicular to the thickness direction and the length direction.

In the case of a ceramic multilayer substrate having a substantially cubic shape, the ceramic multilayer substrate preferably has a thickness of 200 μm or greater and 1400 μm or smaller, a length of 600 μm or greater and 4000 μm or smaller, and a width of 400 μm or greater and 2500 μm or smaller.

Ground Electrode

Each ground electrode is a portion of the wiring layer provided inside the ceramic multilayer substrate and is a portion exposed to a side surface of the ceramic multilayer substrate and electrically connected to the shielding film.

On the same side surface of the ceramic multilayer substrate, ground electrodes are provided at different layers of the ceramic multilayer substrate.

The ground electrodes are exposed at different positions where they do not overlap each other in the thickness direction.

The ground electrodes each may have any thickness, preferably 5 μm or greater and 20 μm or smaller.

The ground electrodes each may protrude from a side surface of the ceramic multilayer substrate.

Each ground electrode may have a protruding length of preferably, but not limited to, 2.5 μm or greater and 10 μm or smaller from the side surface of the ceramic multilayer substrate.

An example of a method of allowing a ground electrode to protrude from a side surface of the ceramic multilayer substrate is a method of plating the surface of a ground electrode not protruding from the side surface of the ceramic multilayer substrate.

In the case where three or more ground electrodes are exposed to the same side surface of the ceramic multilayer substrate, two or more of the ground electrodes may be provided at the same layer or all of the ground electrodes may be provided at different layers as long as the ground electrodes provided at different layers do not overlap each other in the thickness direction.

For example, in the case where three ground electrodes are exposed to the same side surface of the ceramic multilayer substrate, two of the ground electrodes are provided at the same layer of the ceramic multilayer substrate, the other remaining ground electrode is provided at a layer different from that of the aforementioned two ground electrodes, and the three ground electrodes do not overlap each other in the thickness direction of the ceramic multilayer substrate, this ceramic multilayer substrate corresponds to the ceramic multilayer substrate defining the high-frequency electronic component of the present disclosure.

In a side view of the ceramic multilayer substrate, the length of a single ground electrode in the direction perpendicular to the thickness direction of the ceramic multilayer substrate is preferably 50 μm or greater and 400 μm or smaller.

In the high-frequency electronic component of the present disclosure, preferably, the ceramic multilayer substrate includes a first side surface and a second side surface opposite to each other in the length direction perpendicular to the thickness direction, and a third side surface and a fourth side surface opposite to each other in the width direction perpendicular to the thickness direction and the length direction, and on at least one side surface among the first side surface, the second side surface, the third side surface, and the fourth side surface, two or more of the ground electrodes do not overlap each other in the thickness direction of the ceramic multilayer substrate.

Shielding Film

The shielding film covers at least a side surface among the surfaces of the ceramic multilayer substrate.

The shielding film is a metal film formed by sputtering. The film-forming method is not limited to sputtering. For example, the film may be formed by vapor deposition or CVD.

The average thickness of the shielding film is preferably, but not limited to, 1 μm or greater and 50 μm or smaller.

The shielding film may have a single layer, or may have a multilayer structure.

In the case of a multilayer structure, the shielding film is preferably defined by an adhesive layer, a conductive layer, and an anticorrosive layer sequentially from the side close to the ceramic multilayer substrate.

Examples of the material defining the adhesive layer include metals such as stainless steel, Cu, Ti, Cr, Ni, and Ti—Al alloy.

Examples of the material defining the conductive layer include metals such as Cu, Ni, Ag, and Al.

Examples of the material defining the anticorrosive layer include metals such as stainless steel, Ti, Cr, and Ti—Al alloy and metals having a high magnetic permeability such as Ni and permalloy.

The adhesive layer, the conductive layer, and the anticorrosive layer are each preferably formed by sputtering.

The shielding film includes any one of the adhesive layer, the conductive layer, and the anticorrosive layer, preferably includes at least the conductive layer, more preferably includes all of the adhesive layer, the conductive layer, and the anticorrosive layer.

An example of the structure of the high-frequency electronic component of the present disclosure is described with reference to FIG. 1 and FIG. 2.

FIG. 1 is a schematic perspective view of an example of the first embodiment of the high-frequency electronic component of the present disclosure. FIG. 2 is a perspective view of a ceramic multilayer substrate defining the high-frequency electronic component illustrated in FIG. 1.

A high-frequency electronic component 1 illustrated in FIG. 1 includes a ceramic multilayer substrate 10 and a shielding film 50 covering at least the side surfaces among the surfaces of the ceramic multilayer substrate 10.

The high-frequency electronic component 1 has a shape including a first main surface 1a and a second main surface 1b opposite to each other in the thickness direction (the direction indicated by an arrow T in FIG. 1), a first side surface 1c and a second side surface 1d opposite to each other in the length direction (the direction indicated by an arrow L in FIG. 1) perpendicular to the thickness direction, and a third side surface 1e and a fourth side surface 1f opposite to each other in the width direction (the direction indicated by an arrow W in FIG. 1) perpendicular to the thickness direction and the length direction.

The shielding film 50 is provided on the first main surface 1a, the first side surface 1c, the second side surface 1d, the third side surface 1e, and the fourth side surface 1f of the high-frequency electronic component 1, but is not provided on the second main surface 1b thereof.

A second main surface 10b of the ceramic multilayer substrate 10 is exposed to the second main surface 1b.

The second main surface 1b, which is not provided with the shielding film 50, of the high-frequency electronic component 1 serves as a mounting surface. The high-frequency electronic component 1 may be, for example, an LC chip filter.

Figure 2:
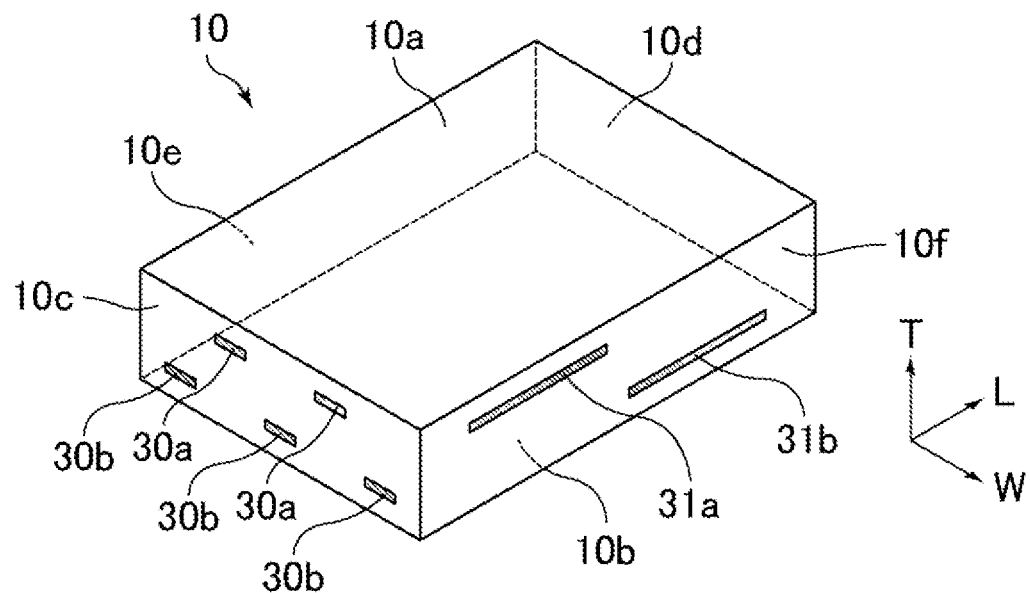
FIG. 2 is a perspective view of a ceramic multilayer substrate defining the high-frequency electronic component illustrated in FIG. 1.

As illustrated in FIG. 2, the ceramic multilayer substrate 10 defining the high-frequency electronic component 1 has a first main surface 10a and the second main surface 10b opposite to each other in the thickness direction (the direction indicated by an arrow T in FIG. 2), a first side surface 10c and a second side surface 10d opposite to each other in the length direction (the direction indicated by an arrow L in FIG. 1) perpendicular to the thickness direction, and a third side surface 10e and a fourth side surface 10f opposite to each other in the width direction (the direction indicated by an arrow W in FIG. 2) perpendicular to the thickness direction and the length direction.

Ground electrodes provided at different layers of the ceramic multilayer substrate 10 are exposed to the first side surface 10c and to the fourth side surface 10f.

The ground electrodes exposed to the first side surface 10c include two first ground electrodes 30a provided at a layer closest to the first main surface 10a among the layers provided with the respective ground electrodes and three second ground electrodes 30b provided at a layer next closest to the first main surface 10a among the layers provided with the respective ground electrodes.

On the first side surface 10c, the first ground electrodes 30a do not overlap the second ground electrodes 30b in the thickness direction of the ceramic multilayer substrate 10.

Since the first ground electrodes 30a do not overlap the second ground electrodes 30b in the thickness direction of the ceramic multilayer substrate 10, this structure prevents any influence of the distance from the target caused by a phenomenon such as the micro-loading effect when sputtering is performed to form a shielding film. The structure is also less likely to cause the shielding film to have an insufficient thickness on the side surfaces of the ceramic multilayer substrate, reducing the occurrence of poor electrical connection.

On the first side surface 10c, the exposed length of the first ground electrodes 30a provided at a layer closest to the first main surface 10a among the layers provided with the respective ground electrodes is preferably smaller than the exposed length of the second ground electrodes 30b provided at a layer next closest to the first main surface 10a among the layers provided with the respective ground electrodes. In this case, the exposed length of the second ground electrodes 30b is greater than the exposed length of the first ground electrodes 30a.

The exposed length of ground electrodes mean the total exposed length of all ground electrodes provided at the same layer in the direction perpendicular to the thickness direction on the same side surface of the ceramic multilayer substrate.

In the case of forming a shielding film by sputtering, the shielding film becomes thicker toward the surface opposite to the surface to serve as a mounting surface (in FIG. 1 and FIG. 2, the second main surface 10b). Accordingly, in the high-frequency electronic component 1 illustrated in FIG. 1 and FIG. 2, the shielding film is likely to have a smaller thickness at a portion connected to the second ground electrodes 30b than at a portion connected to the first ground electrodes 30a. Thus, as illustrated in FIG. 2, in the case where the total exposed length of the second ground electrodes 30b provided at a layer next closest to the first main surface 10a among the layers provided with the respective ground electrodes is preferred to be greater than the total exposed length of the first ground electrodes 30a provided at a layer closest to the first main surface 10a among the layers provided with the respective ground electrodes, the above structure can lead to an increased contact area between the second ground electrodes 30b, which are likely to become thin, and the shielding film 50 and can lead to more stable electrical connection between the second ground electrodes 30b and the shielding film 50.

On the first side surface 10c, preferably, the number of the first ground electrodes 30a provided at a layer closest to the first main surface 10a among the layers provided with the respective ground electrodes is smaller than the number of the second ground electrodes 30b provided at a layer next closest to the first main surface 10a among the layers provided with the respective ground electrodes. In this case, the number of the second ground electrodes 30b is greater than the number of the first ground electrodes 30a.

The greater the number of ground electrodes provided at the same layer of the ceramic multilayer substrate, the less easily burrs are generated on the surfaces of the ground electrodes and the better the connection with the shielding film is.

Thus, as illustrated in FIG. 1 and FIG. 2, in the case where the number of the first ground electrodes 30a is smaller than the number of the second ground electrodes 30b, the second ground electrodes 30b and the shielding film can exhibit improved connection.

The ground electrodes exposed to the fourth side surface 10f include a first ground electrode 31a provided at a layer closest to the first main surface 10a among the layers provided with the respective ground electrodes and a second ground electrode 31b provided at a layer next closest to the first main surface 10a among the layers provided with the respective ground electrodes.

On the fourth side surface 10f, the first ground electrode 31a and the second ground electrode 31b are provided at different layers of the ceramic multilayer substrate 10 and do not overlap each other in the thickness direction.

In FIG. 2, the first ground electrodes 30a exposed to the first side surface 10c and the first ground electrode 31a exposed to the fourth side surface 10f are provided at the same layer in the thickness direction of the ceramic multilayer substrate 10. Alternatively, the first ground electrodes 30a and the first ground electrode 31a exposed to different side surfaces may be provided at different layers.

Similarly, the second ground electrodes 30b exposed to the first side surface 10c and the second ground electrode 31b exposed to the fourth side surface 10f may be provided at different layers of the ceramic multilayer substrate 10.

In the high-frequency electronic component of the present disclosure, preferably, the ceramic multilayer substrate includes a first side surface and a second side surface opposite to each other in the length direction perpendicular to the thickness direction, and a third side surface and a fourth side surface opposite to each other in the width direction perpendicular to the thickness direction and the length direction, on at least one side surface among the first side surface, the second side surface, the third side surface, and the fourth side surface, two or more of the ground electrodes do not overlap each other in the thickness direction of the ceramic multilayer substrate.

In the case where the ceramic multilayer substrate includes a first main surface, a second main surface, a first side surface, a second side surface, a third side surface, and a fourth side surface, the first side surface, the second side surface, the third side surface, and the fourth side surface correspond to the side surfaces of the ceramic multilayer substrate. In other words, a ceramic multilayer substrate in which, on at least one side surface among the first side surface, the second side surface, the third side surface, and the fourth side surface, two or more ground electrodes do not overlap each other in the thickness direction of the ceramic multilayer substrate is encompassed by the ceramic multilayer substrate defining the high-frequency electronic component of the present disclosure.

The ceramic multilayer substrate defining the high-frequency electronic component of the present disclosure is at least such that ground electrodes are exposed to at least one side surface among the four side surfaces and that the ground electrodes are provided at different layers and do not overlap each other in the thickness direction of the ceramic multilayer substrate.

Thus, for example, in the case where a first ground electrode and a second ground electrode are provided at different layers and do not overlap each other in the thickness direction on the first side surface of the ceramic multilayer substrate, no ground electrode may be provided on a different side surface of the ceramic multilayer substrate, or one ground electrode may be exposed thereto, or two or more ground electrodes may be exposed thereto. Still, on a side surface where ground electrodes are exposed, the ground electrodes provided at different layers need not to overlap each other in the thickness direction.

For example, the ceramic multilayer substrate illustrated in FIG. 2 is an example of the case where two or more ground electrodes are exposed to each of the first side surface 10c and the fourth side surfaces 10f.

In the high-frequency electronic component of the present disclosure, an electronic component may be mounted on the first main surface or the second main surface of the ceramic multilayer substrate.

The electronic component mounted on the first main surface or the second main surface is not the high-frequency electronic component of the present disclosure.

Figure 3:
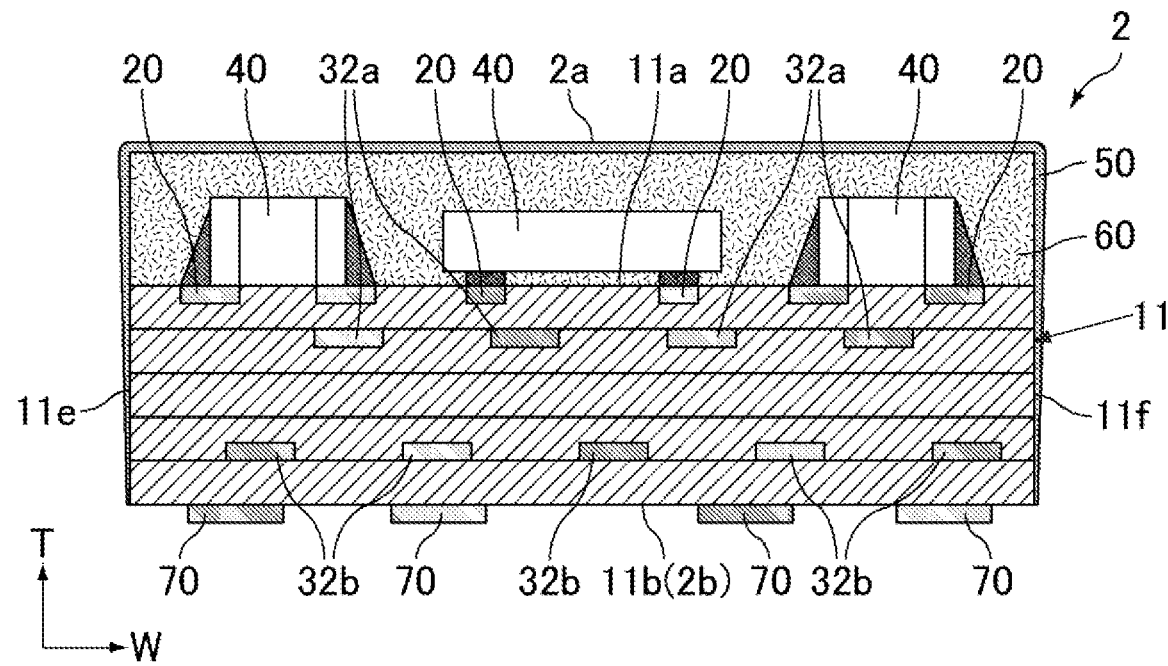
FIG. 3 is a schematic view of another example of the high-frequency electronic component of the present disclosure.

FIG. 3 is a schematic view of another example of the high-frequency electronic component of the present disclosure.

FIG. 3 schematically illustrates the positions of ground electrodes exposed to side surfaces of the ceramic multilayer substrate, electronic components mounted on the first main surface of the ceramic multilayer substrate, and a mold resin sealing the electronic components.

A high-frequency electronic component 2 includes a ceramic multilayer substrate 11 and a shielding film 50.

The ceramic multilayer substrate 11 is provided with electronic components 40 via wiring layers 20 on a first main surface 11a.

The first main surface 11a of the ceramic multilayer substrate 11 and the electronic components 40 are sealed by a mold resin 60. Surfaces (upper surface and side surfaces) of the mold resin 60 and a third side surface 11e and a fourth side surface 11f of the ceramic multilayer substrate 11 are covered with the shielding film 50.

Although not illustrated in FIG. 3, the shielding film 50 also covers a first side surface and a second side surface which are opposite to each other in the direction that is perpendicular to the direction in which the third side surface 11e and the fourth side surface 11f are opposite to each other and that is perpendicular to the thickness direction of the ceramic multilayer substrate.

As illustrated in FIG. 3, the thickness of the shielding film 50 is tapered from the first main surface 2a toward the second main surface 2b. This is because the sputtering is performed with the target being placed closer to the first main surface 2a.

The high-frequency electronic component 2 includes a first main surface 2a and a second main surface 2b opposite to each other in the thickness direction.

The second main surface 11b of the ceramic multilayer substrate 11 is exposed to the second main surface 2b of the high-frequency electronic component 2. Thus, the second main surface 11b of the ceramic multilayer substrate 11 is to serve as a mounting surface.

The second main surface 11b of the ceramic multilayer substrate 11 is provided with mounting terminals 70.

The ceramic multilayer substrate 11 illustrated in FIG. 3 includes first ground electrodes 32a and second ground electrodes 32b exposed to the same side surface (first side surface, not illustrated). The first ground electrodes 32a and the second ground electrodes 32b are provided at different layers of the ceramic multilayer substrate 11 and do not overlap each other in the thickness direction of the ceramic multilayer substrate.

Examples of the types of electronic components mounted on the ceramic multilayer substrate include, but are not limited to, an IC, a SAW filter, a capacitor, an inductor, and a resistor.

Method for Producing High-Frequency Electronic Component

Next, an example of a method for producing the high-frequency electronic component of the present disclosure is described.

Described below is a case where an LTCC material is used as a ceramic material.

First, LTCC green sheets to define ceramic layers are produced.

Next, each green sheet is provided with a via hole at a predetermined site and the via hole is filled with conductive paste. The conductive paste filling the via hole is fired to form a via conductor.

The conductive paste may be prepared by mixing powder of Cu or other metal, a plasticizer, an organic solvent, and other components with a binder. This conductive paste may be further combined with a ceramic material.

Next, conductive paste is printed on a main surface of the green sheet.

Here, the position of printing the conductive paste on each green sheet is adjusted such that ground electrodes exposed to a side surface of a singulated stack do not overlap each other on the same side surface.

The conductive paste may be printed by screen printing, inkjet printing, gravure printing, or the like.

The printed conductive paste is fired to form a wiring layer.

Next, multiple green sheets each provided with the conductive paste to serve as a wiring layer and the conductive paste to serve as a via conductor are stacked, and this stack is compressed in a mold. The pressure and the temperature at this step may be set as appropriate.

Next, the compressed stack is singulated.

Singulation may be performed by dicing, guillotine cutting, laser cutting, or the like.

If necessary, the singulated stacks may be subjected to barrel finishing.

The wiring layers exposed to a side surface of the stack by singulation serve as ground electrodes.

Next, the singulated stacks are fired.

In the case of a Cu-based conductive paste, the stacks are preferably fired in a reducing atmosphere (e.g., $N_2$ atmosphere).

These steps provide a ceramic multilayer substrate.

The first main surface and/or the second main surface of the ceramic multilayer substrate may be provided with any component such as an electronic component or may be sealed by a mold resin, if necessary.

The mold resin used may be a common sealing resin such as a glass epoxy resin, for example.

The surfaces of the ground electrodes exposed to a side surface of the ceramic multilayer substrate may be plated, if necessary.

This plating treatment on the surfaces of the ground electrodes forms protrusions on the ground electrodes and improves the connection between the ground electrodes and the shielding film.

Then, multiple ceramic multilayer substrates are arranged in a tray for sputtering.

In order to prevent unnecessary deposition of the sputtering film (shielding film) on the surface to be the mounting surface of each ceramic multilayer substrate, paste or tape may be attached to this surface in advance.

Adjacent ceramic multilayer substrates arranged in the tray may be apart from each other at any distance.

If necessary, dry etching may be performed before sputtering.

Dry etching may be performed using an Ar ion gun.

Dry etching enables washing of the ceramic multilayer substrates as well as coarsening of the surfaces of the ceramic multilayer substrates, improving the adhesive strength of the shielding film.

Next, the tray for sputtering is placed inside the chamber of a sputtering device and an adhesive layer is formed.

Formation of the adhesive layer is achieved by applying a voltage to a stainless steel target for a predetermined period of time. The thickness thereof is preferably, for example, about 0.01 μm or greater and about 0.5 μm or smaller.

Next, a conductive layer is formed on the adhesive layer by sputtering.

Formation of the conductive layer is achieved by applying a voltage to a Cu target for a predetermined period of time.

The thickness thereof is preferably adjusted to be about 0.9 μm or greater and about 3.0 μm or smaller at a portion covering a side surface of the ceramic multilayer substrate, for example.

Next, an anticorrosive layer is formed on the conductive layer by sputtering, whereby a high-frequency electronic component is obtained.

Formation of the anticorrosive layer is achieved by applying a voltage to a stainless steel target for a predetermined period of time.

The thickness thereof is preferably, for example, about 0.03 μm or greater and about 1.5 μm or smaller.

The high-frequency electronic component of the present disclosure may be a chip component or a substrate.

A product further including a passive element incorporated in the ceramic multilayer substrate is an example of the high-frequency electronic component of the present disclosure used as a chip component.

Examples of the passive element include a capacitor, an inductor, and an LC filter.

A product further including a different electronic component mounted on the ceramic multilayer substrate is an example of the high-frequency electronic component of the present disclosure used as a substrate.

The different electronic component is preferably mounted on the first main surface or the second main surface of the ceramic multilayer substrate.

Examples of the different electronic component include a capacitor, an inductor, a resistor, a filter, and an IC.

Module

The module of the present disclosure includes the high-frequency electronic component of the present disclosure.

Examples of the module of the present disclosure include a module including a substrate and the high-frequency electronic component of the present disclosure mounted on the substrate and a module including a ceramic multilayer substrate defining the high-frequency electronic component, an electronic component mounted on each of the first main surface and the second main surface of the ceramic multilayer substrate, and a mold resin sealing the electronic components.

An example of the module is, for example, an RF module.

Figure 4:
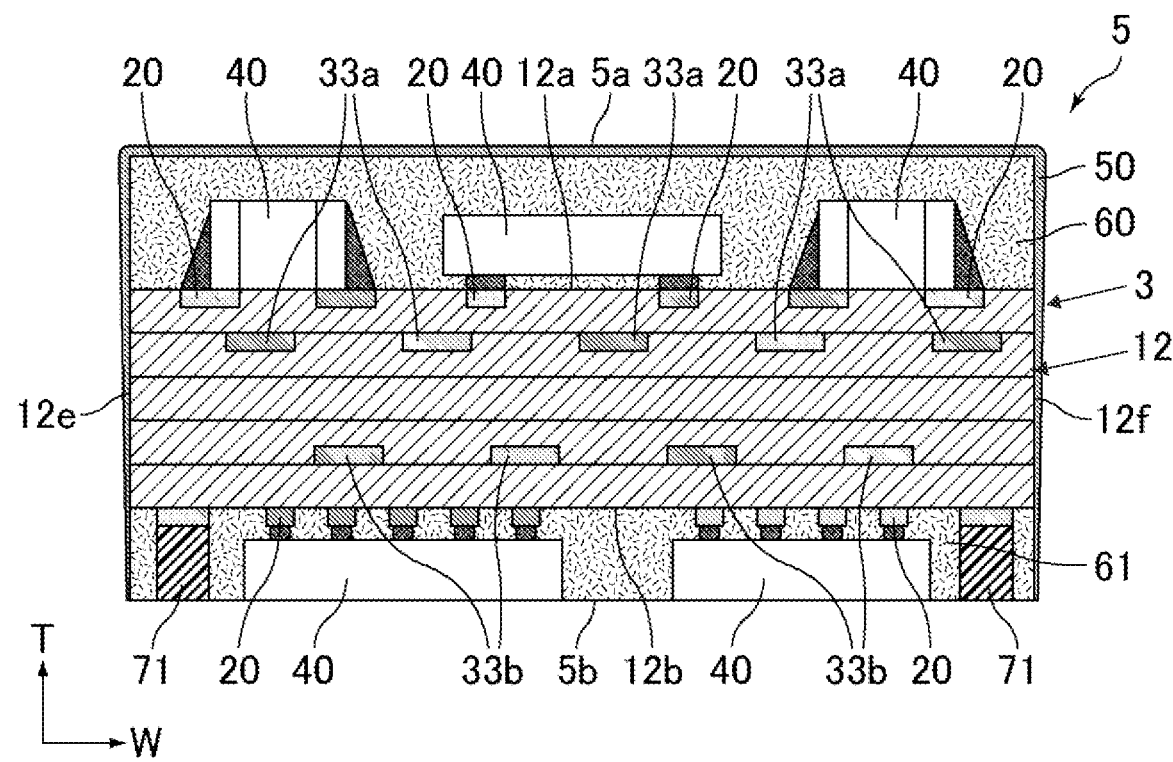
FIG. 4 is a schematic view of an example of the module of the present disclosure.

FIG. 4 is a schematic view of an example of the module of the present disclosure.

FIG. 4 schematically illustrates the positions of ground electrodes exposed to side surfaces of the ceramic multilayer substrate, electronic components mounted on the first main surface and the second main surface of the ceramic multilayer substrate, and mold resins sealing the electronic components.

A module 5 includes a high-frequency electronic component 3 including a ceramic multilayer substrate 12 and a shielding film 50 and electronic components 40 each mounted on a first main surface 12a or a second main surface 12b of the ceramic multilayer substrate 12 via a corresponding wiring layer(s) 20. Each of the electronic components 40 mounted on the first main surface 12a or the second main surface 12b of the ceramic multilayer substrate 12 is sealed by a mold resin 60 or 61.

A third side surface 12e and a fourth side surface 12f of the ceramic multilayer substrate 12 are covered with the shielding film 50. Also, side surfaces and the upper surface of the mold resin 60 and side surfaces of the mold resin 61 are covered with the shielding film 50.

The second main surface 12b of the ceramic multilayer substrate 12 is provided with mounting terminals 71 penetrating the mold resin 61, with the mounting terminals 71 exposed to a second main surface 5b of the module 5. Thus, the second main surface 5b serves as the mounting surface among the first main surface 5a and the second main surface 5b of the module 5 opposite to each other in the thickness direction.

The module 5 is also referred to as a double-mounted module because both the first main surface 12a and the second main surface 12b of the ceramic multilayer substrate 12 defining the high-frequency electronic component 3 are provided with the electronic components 40.

The ceramic multilayer substrate 12 illustrated in FIG. 4 includes first ground electrodes 33a and second ground electrodes 33b exposed to the same side surface. The first ground electrodes 33a and the second ground electrodes 33b are provided at different layers of the ceramic multilayer substrate 12 and do not overlap each other in the thickness direction of the ceramic multilayer substrate 12.

In the module of the present disclosure, the electronic components mounted on the first main surface and the second main surface of the ceramic multilayer substrate defining the high-frequency electronic component are each the same as the electronic component that may be mounted on the first main surface or the second main surface of the ceramic multilayer substrate in the high-frequency electronic component of the present disclosure.

EXAMPLES

The following provides examples that more specifically disclose the high-frequency electronic component of the present disclosure. The present disclosure is not limited to these examples.

Example 1

Green sheets were each punched to be provided with a through hole. This through hole was filled with a copper-containing conductive paste, whereby a via conductor was formed.

The copper-containing conductive paste contained glass powder, which is the low temperature co-fired ceramic material contained in the green sheets. The weight proportion of the low temperature co-fired ceramic material to the total weight of the metal and the low temperature co-fired ceramic material in the conductive paste was 10%.

Further, conductive paste was printed in a pattern to form a wiring layer including ground electrodes.

Then, the green sheets were stacked and the resulting stack was pressed in the thickness direction.

Next, the pressed stack was cut and singulated.

The cut and singulated stacks were then fired, whereby ceramic multilayer substrates were obtained.

The low temperature co-fired ceramic material and the conductive paste were co-fired, whereby insulating layers, wiring layers, and ground electrodes were formed.

The thickness per single insulating layer formed after the firing was 2 μm in the form of insulating layer in the case where the thickness was 4 μm in the form of green sheet.

The thickness of each ground electrode was 5 μm.

On one side surface of the resulting ceramic multilayer substrate, two ground electrodes were exposed at different layers of the ceramic multilayer substrate and the two ground electrodes did not overlap each other in the thickness direction of the ceramic multilayer substrate.

The distance between the layers provided with the respective ground electrodes in the thickness direction of the ceramic multilayer substrate was 6 μm.

Formation of Shielding Film

The ceramic multilayer substrate was placed inside the chamber of a sputtering device and the following layers were formed in the stated order so that the shielding film was formed. The thicknesses of the layers of the shielding film formed on the surface of the ground electrode at a position closest to the target were adjusted to the following values.

1) Adhesive layer: stainless steel target, thickness 0.3 μm
2) Conductive layer: Cu target, thickness 1.0 μm
3) Anticorrosive layer: stainless steel target, thickness 0.7 μm The shielding film was formed on the ceramic multilayer substrate by the aforementioned procedure, whereby a high-frequency electronic component was produced.

Comparative Example 1

A ceramic multilayer substrate and a high-frequency electronic component according to Comparative Example 1 were produced in the same procedure as in Example 1 except for the pattern of printing the conductive paste.

In the ceramic multilayer substrate of Comparative Example 1, the thickness of each insulating layer was equal to the thickness of each ground electrode. On one side surface of the ceramic multilayer substrate, two ground electrodes were exposed at different layers of the ceramic multilayer substrate. The two ground electrodes overlapped each other in the thickness direction of the ceramic multilayer substrate. The distance between the layers provided with the respective ground electrodes in the thickness direction of the ceramic multilayer substrate was 6 μm.

Measurement of Peeling Strength of Shielding Film

Cellotape© (available from Nichiban Co., Ltd.) was attached to the surface of the shielding film of each of the high-frequency electronic components according to Example 1 and Comparative Example 1, and the workpieces were subjected to a peeling test.

For the high-frequency electronic component according to Example 1, no peeling of the shielding film was observed. In contrast, for the high-frequency electronic component according to Comparative Example 1, peeling of the shielding film was observed at the surface of the ground electrode farther from the target.

These results demonstrate that the high-frequency electronic component of the present disclosure achieves high adhesion of the shielding film and excellent electric connection.

High-Temperature Exposure Test

The high-frequency electronic components according to Example 1 and Comparative Example 1 were kept warm at 150° C. for 2000 hours, and the variation in resistance before and after the test was measured.

The high-frequency electronic component according to Example 1 had a variation in resistance of lower than 3%, while the high-frequency electronic component according to Comparative Example 1 had a variation in resistance of higher than 3% but not higher than 5%.

These results demonstrate that the high-frequency electronic component of the present disclosure exhibits a reduced variation in resistance under high-temperature conditions and achieves excellent reliability.

1, 2, 3: high-frequency electronic component
   1a, 2a: first main surface of high-frequency electronic component
   1b, 2b: second main surface of high-frequency electronic component 1c: first side surface of high-frequency electronic component
1d: second side surface of high-frequency electronic component
1e: third side surface of high-frequency electronic component
1f: fourth side surface of high-frequency electronic component
5: module
5a: first main surface of module
5b: second main surface of module
10, 11, 12: ceramic multilayer substrate
10a, 11a, 12a: first main surface of ceramic multilayer substrate
10b, 11b, 12b: second main surface of ceramic multilayer substrate
10c: first side surface of ceramic multilayer substrate
10d: second side surface of ceramic multilayer substrate
10e, 11e, 12e: third side surface of ceramic multilayer substrate
10f, 11f, 12f: fourth side surface of ceramic multilayer substrate
20: wiring layer
30a, 31a, 32a, 33a: first ground electrode
30b, 31b, 32b, 33b: second ground electrode
40: electronic component
50: shielding film
60, 61: mold resin
70, 71: mounting terminal

The invention claimed is:

1. A high-frequency electronic component comprising:
a ceramic multilayer substrate;
ground electrodes provided at different layers of the ceramic multilayer substrate; and
a shielding film covering at least a side surface among surfaces of the ceramic multilayer substrate,
two or more of the ground electrodes being exposed to the side surface of the ceramic multilayer substrate and being electrically connected to the shielding film,
on the side surface of the ceramic multilayer substrate, the two or more of the ground electrodes not overlapping each other in a thickness direction of the ceramic multilayer substrate.

2. The high-frequency electronic component according to claim 1,
wherein the two or more of the ground electrodes protrude from the side surface of the ceramic multilayer substrate.

3. The high-frequency electronic component according to claim 1,
wherein the ceramic multilayer substrate includes a first main surface and a second main surface opposite to each other in the thickness direction,
the second main surface is a main surface to be a mounting surface,
on the side surface of the ceramic multilayer substrate, the two or more of the ground electrodes including a first ground electrode and a second ground electrode, the first ground electrode being provided at a layer closest to the first main surface among the layers provided with the respective ground electrodes, and the second ground electrode being provided at a layer next closest to the first main surface among the layers provided with the respective ground electrodes, with an exposed length of the second ground electrode being greater than an exposed length of the first ground electrode.

4. The high-frequency electronic component according to claim 1,
wherein the ceramic multilayer substrate includes a first main surface and a second main surface opposite to each other in the thickness direction,
the second main surface is a main surface to be a mounting surface,
on the side surface of the ceramic multilayer substrate, the two or more of the ground electrodes including one or more first ground electrodes and one or more second ground electrodes, the one or more first ground electrodes being provided at a layer closest to the first main surface among the layers provided with the respective ground electrodes, and the one or more second ground electrodes being provided at a layer next closest to the first main surface among the layers provided with the respective ground electrodes, with a number of the one or more first ground electrodes being smaller than a number of the one or more second ground electrodes.

5. The high-frequency electronic component according to claim 1,
wherein the ceramic multilayer substrate includes a first side surface and a second side surface opposite to each other in a length direction perpendicular to the thickness direction, and a third side surface and a fourth side surface opposite to each other in a width direction perpendicular to the thickness direction and the length direction,
on at least one side surface among the first side surface, the second side surface, the third side surface, and the fourth side surface, the two or more of the ground electrodes do not overlap each other in the thickness direction of the ceramic multilayer substrate.

6. The high-frequency electronic component according to claim 1,
wherein the high-frequency electronic component is a chip component or a substrate.

7. A module comprising the high-frequency electronic component according to claim 1.

8. The module according to claim 7,
wherein the ceramic multilayer substrate includes a first main surface and a second main surface opposite to each other in the thickness direction,
the first main surface and the second main surface of the ceramic multilayer substrate are each provided with an electronic component,
the electronic component mounted on the first main surface and the electronic component mounted on the second main surface are each sealed by a mold resin,
the shielding film covers the side surface of the ceramic multilayer substrate and a side surface of the mold resin.

9. The high-frequency electronic component according to claim 2,
wherein the two or more of the ground electrodes each comprise a wiring layer exposed to the side surface of the ceramic multilayer substrate but not protruding from the side surface and a protrusion provided on the wiring layer.

10. The high-frequency electronic component according to claim 2,
wherein the ceramic multilayer substrate includes a first main surface and a second main surface opposite to each other in the thickness direction,
the second main surface is a main surface to be a mounting surface, on the side surface of the ceramic multilayer substrate, the two or more of the ground electrodes including a first ground electrode and a second ground electrode, the first ground electrode being provided at a layer closest to the first main surface among the layers provided with the respective ground electrodes, and the second ground electrode being provided at a layer next closest to the first main surface among the layers provided with the respective ground electrodes, with an exposed length of the second ground electrode being greater than an exposed length of the first ground electrode.

11. The high-frequency electronic component according to claim 2,
wherein the ceramic multilayer substrate includes a first main surface and a second main surface opposite to each other in the thickness direction,
the second main surface is a main surface to be a mounting surface,
on the side surface of the ceramic multilayer substrate, the two or more of the ground electrodes including one or more first ground electrodes and one or more second ground electrodes, the one or more first ground electrodes being provided at a layer closest to the first main surface among the layers provided with the respective ground electrodes, and the one or more second ground electrodes being provided at a layer next closest to the first main surface among the layers provided with the respective ground electrodes, with a number of the one or more first ground electrodes being smaller than a number of the one or more second ground electrodes.

12. The high-frequency electronic component according to claim 3,
wherein the ceramic multilayer substrate includes a first main surface and a second main surface opposite to each other in the thickness direction,
the second main surface is a main surface to be a mounting surface,
on the side surface of the ceramic multilayer substrate, the two or more of the ground electrodes including one or more first ground electrodes and one or more second ground electrodes, the one or more first ground electrodes being provided at a layer closest to the first main surface among the layers provided with the respective ground electrodes, and the one or more second ground electrodes being provided at a layer next closest to the first main surface among the layers provided with the respective ground electrodes, with a number of the one or more first ground electrodes being smaller than a number of the one or more second ground electrodes.

13. The high-frequency electronic component according to claim 2,
wherein the ceramic multilayer substrate includes a first side surface and a second side surface opposite to each other in a length direction perpendicular to the thickness direction, and a third side surface and a fourth side surface opposite to each other in a width direction perpendicular to the thickness direction and the length direction,
on at least one side surface among the first side surface, the second side surface, the third side surface, and the fourth side surface, the two or more of the ground electrodes do not overlap each other in the thickness direction of the ceramic multilayer substrate.

14. The high-frequency electronic component according to claim 3,
wherein the ceramic multilayer substrate includes a first side surface and a second side surface opposite to each other in a length direction perpendicular to the thickness direction, and a third side surface and a fourth side surface opposite to each other in a width direction perpendicular to the thickness direction and the length direction,
on at least one side surface among the first side surface, the second side surface, the third side surface, and the fourth side surface, the two or more of the ground electrodes do not overlap each other in the thickness direction of the ceramic multilayer substrate.

15. The high-frequency electronic component according to claim 4,
wherein the ceramic multilayer substrate includes a first side surface and a second side surface opposite to each other in a length direction perpendicular to the thickness direction, and a third side surface and a fourth side surface opposite to each other in a width direction perpendicular to the thickness direction and the length direction,
on at least one side surface among the first side surface, the second side surface, the third side surface, and the fourth side surface, the two or more of the ground electrodes do not overlap each other in the thickness direction of the ceramic multilayer substrate.

16. The high-frequency electronic component according to claim 2,
wherein the high-frequency electronic component is a chip component or a substrate.

17. The high-frequency electronic component according to claim 3,
wherein the high-frequency electronic component is a chip component or a substrate.

18. The high-frequency electronic component according to claim 4,
wherein the high-frequency electronic component is a chip component or a substrate.

19. The high-frequency electronic component according to claim 5,
wherein the high-frequency electronic component is a chip component or a substrate.

20. A module comprising the high-frequency electronic component according to claim 2.

* * * * *